United States Patent
Noguchi

(10) Patent No.: US 6,486,752 B1
(45) Date of Patent: *Nov. 26, 2002

(54) SURFACE ACOUSTIC WAVE FILTER PATTERN WITH GROUNDING VIA CONNECTION LINES TO DICING LINES

(75) Inventor: Kazushige Noguchi, Tokyo (JP)

(73) Assignee: Oki Electric Industry Co, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/540,752

(22) Filed: Mar. 31, 2000

(30) Foreign Application Priority Data

Nov. 4, 1999 (JP) ............................................ 11-314355

(51) Int. Cl.[7] .................................................. H03H 9/64
(52) U.S. Cl. .................................. 333/195; 310/313 D
(58) Field of Search ................................ 333/193–196; 310/313 R, 313 B, 313 C, 313 D; 29/25.35

(56) References Cited

U.S. PATENT DOCUMENTS

| | | | | |
|---|---|---|---|---|
| 5,243,249 A | * | 9/1993 | Miyashita et al. | 333/195 X |
| 5,325,573 A | * | 7/1994 | Miyashita et al. | 333/195 X |
| 5,701,645 A | * | 12/1997 | Allen et al. | 33/193 X |
| 5,771,556 A | * | 6/1998 | Allen et al. | 333/193 X |

FOREIGN PATENT DOCUMENTS

| | | | |
|---|---|---|---|
| JP | 58-43607 | 3/1983 | |
| JP | 5-267971 | * 10/1993 | ................ 29/25.35 |
| JP | 6-204779 | * 7/1994 | ................ 29/25.35 |
| JP | 9-167932 | 6/1997 | |
| JP | 10-70430 | * 3/1998 | |
| JP | 11-298289 | * 10/1999 | |
| JP | 2000-40932 | * 2/2000 | |

* cited by examiner

Primary Examiner—Robert Pascal
Assistant Examiner—Barbara Summons
(74) Attorney, Agent, or Firm—Venable; Norman N. Kunitz

(57) ABSTRACT

In a surface acoustic wave filter having tooth comb-type cross electrodes provided over a plurality of levels, connection patterns to connect and ground all the patterns on a chip via dicing lines are provided with at least one of the connection patterns provided between reflectors. Thus, all the electrode patterns are grounded even in a surface acoustic wave filter with the tooth comb-type cross electrodes provided over a plurality of levels, and, as a result, electrostatic breakdown due to discharge can be prevented.

20 Claims, 6 Drawing Sheets

SURFACE ACOUSTIC WAVE FILTER PATTERN WITH GROUNDING VIA CONNECTION LINES TO DICING LINES

BACKGROUND OF THE INVENTION

The present invention relates to an electrode pattern structure in a surface acoustic wave (hereafter referred to SAW) filter which is utilized in the wireless portion of a mobile communication device such as a cellular phone and a SAW filter manufacturing method.

FIG. 3(a) is a circuit diagram of a ladder-type SAW filter in the prior art. Between input terminals 33 and 34 and output terminals 35 and 36, SAW resonators 31 are provided in a series arm and SAW resonators 32 are provided in respective parallel arms. This is a ladder-type resonator structure achieving so-called duplex mode resonance characteristics. FIG. 3(b) shows the electrode pattern in the SAW resonators 31 and 32. The SAW resonators 31 and 32 both adopt a resonator structure achieved by arraying reflection elements (electrode fingers) constituting two grating reflectors 37 and 38 and an IDT (inter-digital transducer) 39 provided between them over a half wavelength cycle. The IDT 39 is constituted of crossed or interleaved electrodes achieved by crossing or interleaving two tooth comb-type electrodes as shown in the figure.

A method for manufacturing this ladder-type SAW filter may be summarized as below. Using a substrate constituted of a piezoelectric material, a wafer processing step is performed several times through photolithography. The electrode pattern that includes the reflectors, the IDTs and the like mentioned above is formed with a metal film. A number of ladder-type SAW filter chips are manufactured on the wafer. Then, the wafer is cut into individual chips.

During the photolithography step, which is performed several times as described above, hard contact exposure and soft contact exposure are implemented. In addition, each SAW resonator has several hundred comb shape pairs of mutually opposed primary electrode fingers and secondary electrode fingers. Thus, the SAW resonators become electrically charged readily during the manufacturing process and a great deal of static electricity is generated between the wafer and the manufacturing equipment. Furthermore, changes in temperature tend to be caused by the thermal load imparted during the assembly step, which often results in occurrence of an electrical discharge. A discharge occurring between crossed electrodes destroys them. In order to prevent this, a discharge prevention pattern that equalizes the potentials at the areas of the metal film corresponding to one of the plurality of crossed electrodes formed thereupon is provided as disclosed in Japanese Publication No. 58-43607. By providing the discharge prevention pattern, it is possible to prevent electrostatic breakdown from occurring during the wafer process and the SAW filter assembly step. The discharge prevention pattern includes a connection pattern extending from the electrodes to a dicing line (the line used as a guide when cutting the wafer into individual chips). This connection pattern is formed concurrently with the formation of the crossed electrodes implemented in the wafer process. Thus, the potentials at the plurality of crossed electrodes are equalized in the first place to ensure that no discharge occurs due to a potential difference. This discharge prevention pattern is required in all the electrode patterns formed through the photolithography step implemented during a first stage, to ensure that the potentials of the electrode patterns are equalized.

A discharge is prevented by providing the discharge prevention pattern described above in a SAW filter pattern with standard ladder-type resonators. However, it is not always possible to provide a discharge prevention pattern in a pattern adopting a power withstanding structure, which may be employed on the transmission side of a SAW wave-splitter, for the reasons given below.

In a pattern adopting a power withstanding structure, the crossing length at the crossed electrodes in the individual SAW resonators may be set to a large value to increase the resistance component. This makes it possible to reduce the electrical load on each unit so that the SAW resonator is prevented from being destroyed by intense power such as that imparted by a power amplifier or the like. However, if the crossed electrodes are simply lengthened to achieve a greater crossing length, impedance matching for the filter is not achieved, and thus, this method is not desirable. Accordingly, the original length of crossed electrodes is doubled and two identical SAW resonators are connected in series. In other words, a resonator having crossed electrodes over two levels is prepared. The original SAW resonator is replaced by the unit constituted by connecting two identical SAW resonators in series.

FIG. 4 shows the structure of the SAW filter electrode pattern formed on a chip in this manner. Reflectors 43, 44, 45, 46, 47, 48, 49 and 50 are provided on both sides of IDTs 41 and 42, each having tooth comb-type crossed electrodes provided over two levels. In addition, an output pad 52 and wire bonding pads 53 and 54 are connected with the individual electrodes via a wiring pattern 51. At the periphery, a dicing line 55 which is used as a guide when cutting the wafer into individual chips is provided. FIG. 5 is a circuit diagram of a SAW filter adopting the electrode pattern shown in FIG. 4. SAW resonators 31' provided in the series arm in FIG. 5 are each constituted of the IDT 41 and the reflectors 43, 44, 45 and 46 in FIG. 4. Likewise, SAW resonators 32' provided in the parallel arms in FIG. 5 are each constituted of the IDT 42 and the reflectors 47, 48, 49 and 50 shown in FIG. 4.

In FIG. 6, connection patterns 61, 62, 63, 64, 65 and 66 for discharge prevention are provided in the pattern shown in FIG. 4. As illustrated in the figure, it is not possible to provide a discharge prevention pattern extending from the common center electrodes of the IDTs 41 and 42 to the dicing line 55 due to the blocking presence of the reflectors. If a discharge prevention pattern is formed extending from the common center electrode of IDT 42 along the direction in which no reflector is present, i.e., over the area indicated by the dotted lines in the figure, the common electrode of IDT 42 can be connected to the dicing line and thus becomes grounded. However, this formation method is not desirable since some of the electrodes of the IDT 42 may become longer than the rest or changes in the characteristics may occur when the wafer is divided into individual chips along the dicing line. Ultimately, a discharge prevention pattern that connects the common electrode of IDT 42 with the dicing line cannot be provided, which makes the common electrode of IDT 42 an ungrounded floating electrode posing a risk of electrical discharge occurring during the process. Likewise, the IDT 41 becomes a floating electrode, posing a risk of discharge. It is necessary to ground all the electrodes to prevent discharge. However, in the pattern having electrodes with tooth comb-type crossed electrodes provided over two levels as described above, there is a problem in that the entire electrode pattern cannot always be grounded.

SUMMARY OF THE INVENTION

An object of the present invention, which has been completed by addressing the problem of the prior art discussed above, is to provide a surface acoustic wave filter pattern that makes it possible to prevent an electrostatic breakdown from occurring due to a discharge by grounding all the electrode patterns even in a SAW filter having electrodes achieved by providing tooth comb-type crossed electrodes over a plurality of levels and a method for manufacturing a surface acoustic wave filter.

In order to, achieve the object described above, in a first aspect of the present invention, a surface acoustic wave filter pattern achieved by connecting in a ladder pattern surface acoustic wave resonators each having tooth comb-type crossed electrodes provided over a plurality of levels and reflectors in which connection patterns are provided to connect and ground all the patterns on a chip via dicing lines and at least one of the connection patterns is provided between reflectors is provided. As a result, all the patterns become grounded, and the electrodes can be protected from electrostatic breakdown during the wafer process and the assembly step by preventing a discharge from occurring due to a potential difference.

It is to be noted that pads may be provided within the connection patterns. By placing a probing terminal in contact with such a pad, the open/short state of each chip can be detected so that defective chips can be eliminated prior to assembly.

In addition, in a second aspect of the present invention, a surface acoustic wave filter manufacturing method achieved by providing connection patterns for connecting and grounding all the patterns on a chip via dicing lines and forming at least one of the connection patterns between reflectors when forming a surface acoustic wave filter pattern constituted by connecting in a ladder pattern surface acoustic wave resonators each having tooth comb-type crossed electrodes provided over a plurality of levels and reflectors on the chip is provided. It is to be noted that during this manufacturing process, pads may be provided within the connection patterns.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of the embodiments of the present invention, given in reference to the drawings. A wafer processing step constituted of first through third photolithography processes is explained below as an example of a process that may be implemented to manufacture SAW filters. First, a $LiTaO_3$ substrate is washed, and the substrate is heated after a resist is applied onto its surface. Then, using a mask having the same dimensions as the pattern, hard contact exposure is performed by irradiating UV light. Next, development is performed while the substrate is continuously heated to form a resist pattern to be utilized to eliminate unnecessary portions through lift off. Subsequently, a metal film (e.g. Al) is formed through deposition at comb teeth electrode fingers which will constitute the basis of SAW resonators and connecting lines that connect the SAW resonators. The portions that are not part of the pattern are removed through lift off. The above is an overall flow of the first photolithography process.

The second and third photolithography processes are implemented by following procedures that are basically similar to that in the first photolithography process. First, a resist is applied and in the second photolithography process, soft contact exposure is performed by using a mask that protects the main pattern. Then, an oxide film ($SiO_2$) is sputtered. In the third photolithography process, soft contact exposure is performed with a mask that is utilized to form pads for wire bonding and a film to be placed over the connecting lines for power withstanding discharge. Then, a metal film (Au) is deposited. A lift off is performed in a similar manner to remove the unnecessary portions which do not constitute the pattern. The above is the flow of the wafer processing step.

Figure 1:
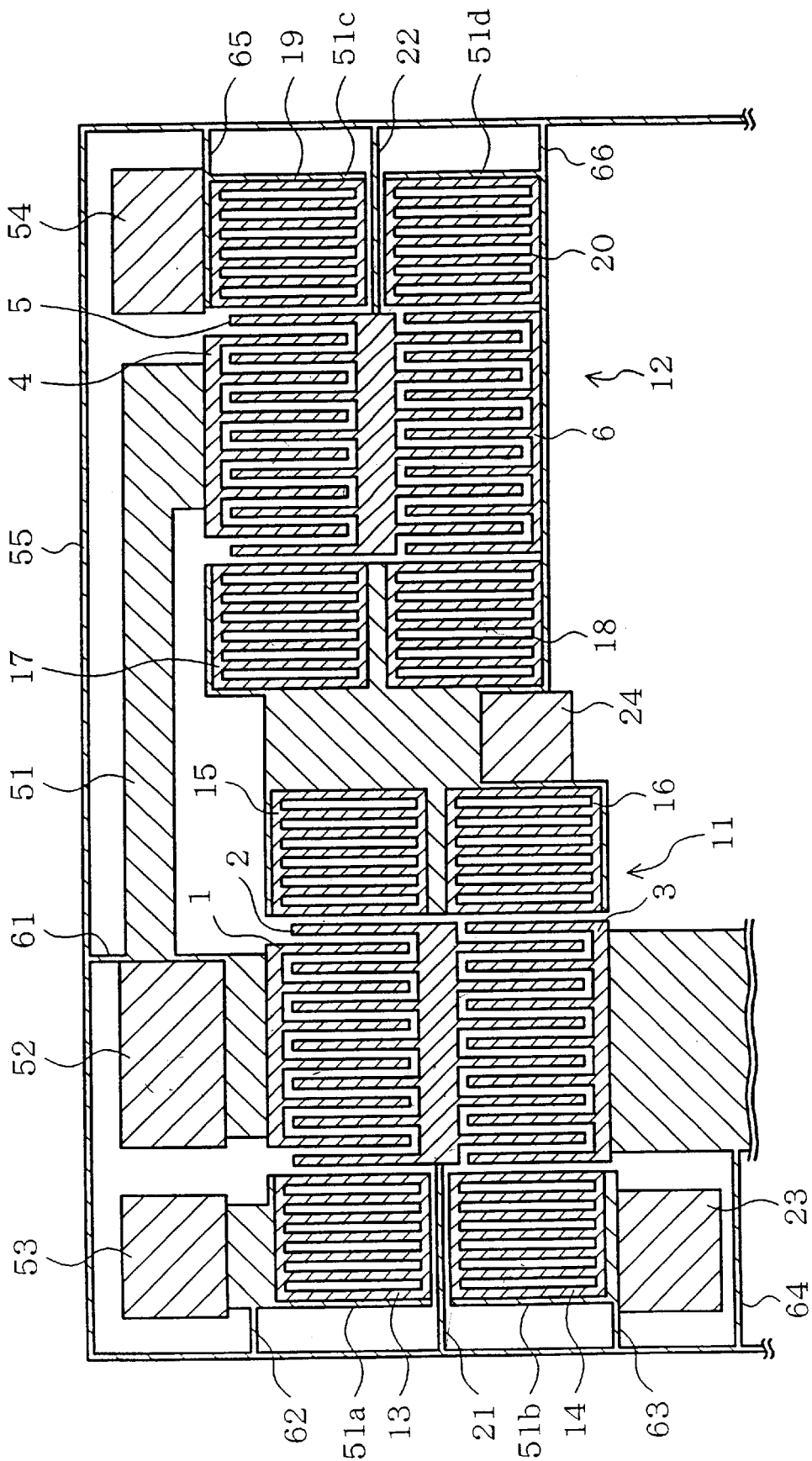
FIG. 1 is a plan view illustrating the structure of the SAW filter electrode pattern in a first embodiment of the present invention.

FIG. 1 is a plan view illustrating the structure of the SAW filter electrode pattern formed on a chip in the first embodiment of the present invention. Tooth comb-type electrodes 1, 2 and 3 constitute an IDT 11 and tooth comb-type electrodes 4, 5 and 6 constitute an IDT 12. In the pattern shown in FIG. 1, the IDT 11 and reflectors 13, 14, 15 and 16 constitute the SAW resonators in the series arm and the IDT 12 and reflectors 17, 18, 19 and 20 constitute the SAW resonators in the parallel arms, as in the pattern in FIG. 6.

Figure 6:
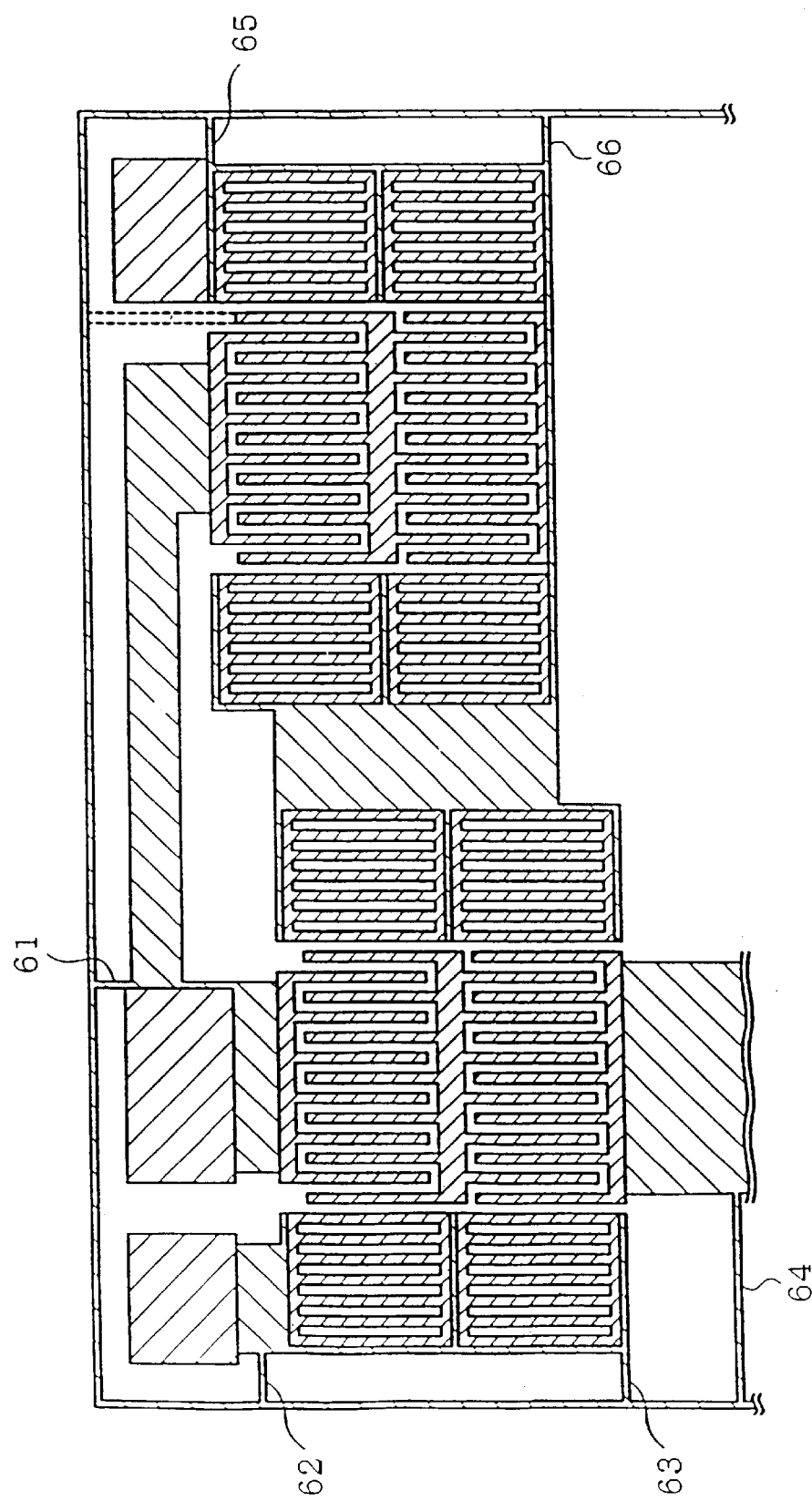
FIG. 6 is a plan view illustrating the structure of a SAW filter electrode pattern adopted in the prior art.

However, in this pattern, the width of the tooth comb-type electrode 2 over the portion excluding the comb teeth along the vertical direction is larger than the corresponding width in the IDT 41 in FIG. 6. In addition, the distance between the upper and lower reflectors is set wider. Wiring patterns 51a and 51b are formed so as to isolate the reflectors 13 and 14 from each other. Also, a connection pattern 21 is formed extending from the tooth-comb electrode 2 and through the space between the reflector 13 and the reflector 14 to connect with a dicing line 55. As a new addition, a pad 23 for wire bonding is formed. These are the differences of the series arm electrodes from those shown in FIG. 6.

Similar modifications are made for the parallel arm electrodes as well. The width of the tooth comb-type electrode 5 over the portion excluding the comb teeth along the vertical direction is larger than the corresponding width in the IDT 42 in FIG. 6. In addition, the distance between the upper and lower reflectors is set wider. Wiring patterns 51c and 51d are formed so as to cut off the reflectors 19 and 20 from each other. Also, a connection pattern 22 is formed extending from the tooth comb-electrode 5 and through the space between the reflector 19 and the reflector 20 to connect with a dicing line 55. As a new addition, a pad 24 for wire bonding is formed. Other structural features of the pattern are the same as those in FIG. 6. Similar modifications are made for other series arm electrodes and parallel arm electrodes in the circuit.

By allowing a greater distance between the upper and lower reflectors and forming the wiring patterns 51a, 51b, 51c and 51d so as to cut off the reflectors 13 and 14 from each other and the reflectors 19 and 20 from each other, it becomes possible to form the connection patterns 21 and 22. As a result, electrodes that are constituted as ungrounded floating electrodes in the prior art become connected to the dicing line. In addition, by forming the pads 23 and 24, it becomes possible to connect the floating reflectors to a package ground to ground them.

In this embodiment, before the wafer is cut into individual chips along the dicing lines, all the electrodes patterns on the wafer are connected to the dicing lines and grounded, achieving equalized potential. As a result, no discharge occurs due to a potential difference. During the three photolithography processes implemented in the wafer processing step, too, the capacity at which the electrodes become charged is reduced. Even if a drastic change occurs in the temperature during assembly, the tooth comb-type electrodes can be protected from an electrostatic breakdown occurring due to a discharge. In addition, after the wafer is divided along the dicing lines, all the electrodes patterns become isolated from one another.

Figure 2:
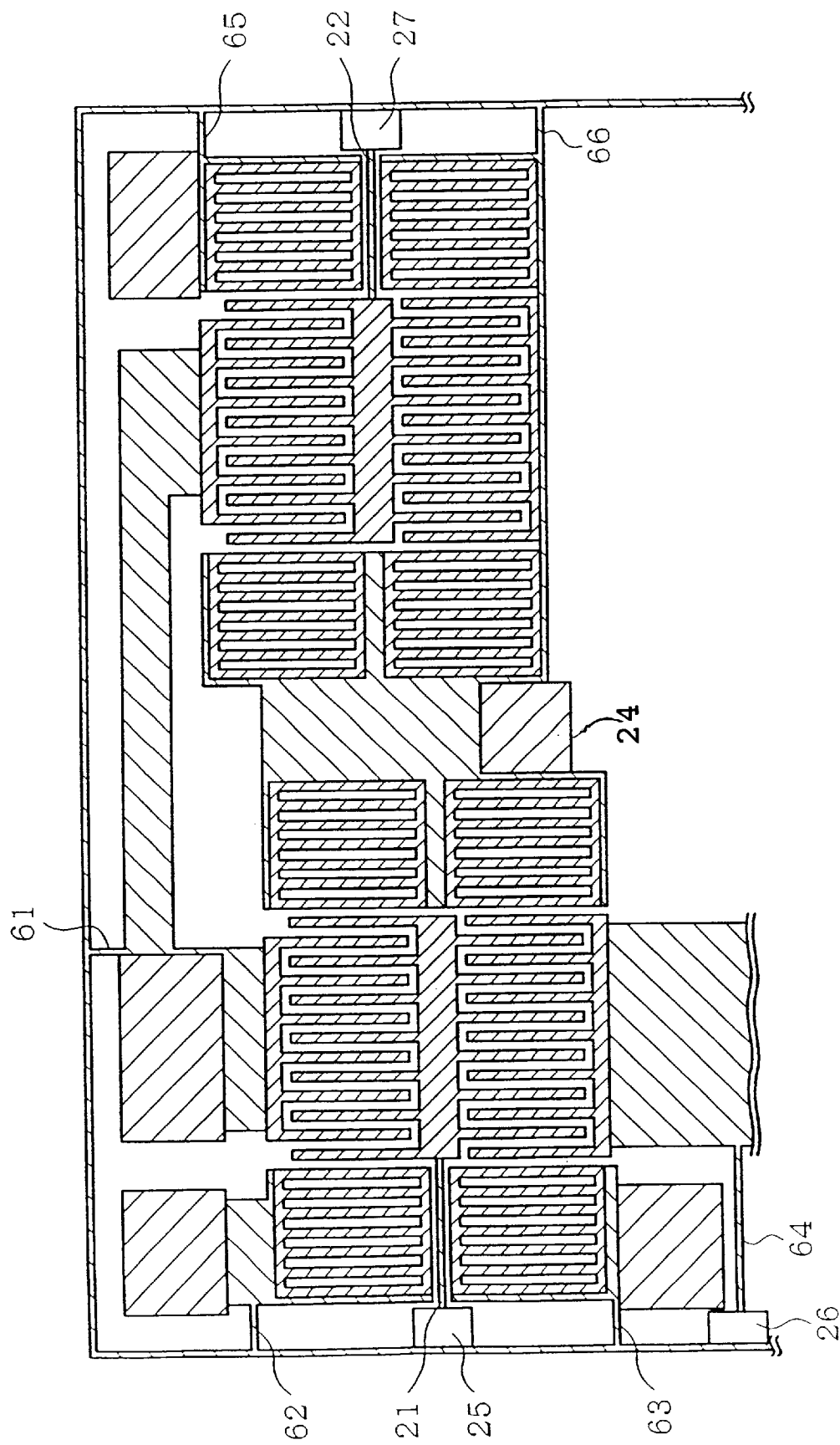
FIG. 2 is a plan view illustrating the structure of a SAW filter electrode pattern in a second embodiment of the present invention.
Figure 3A:
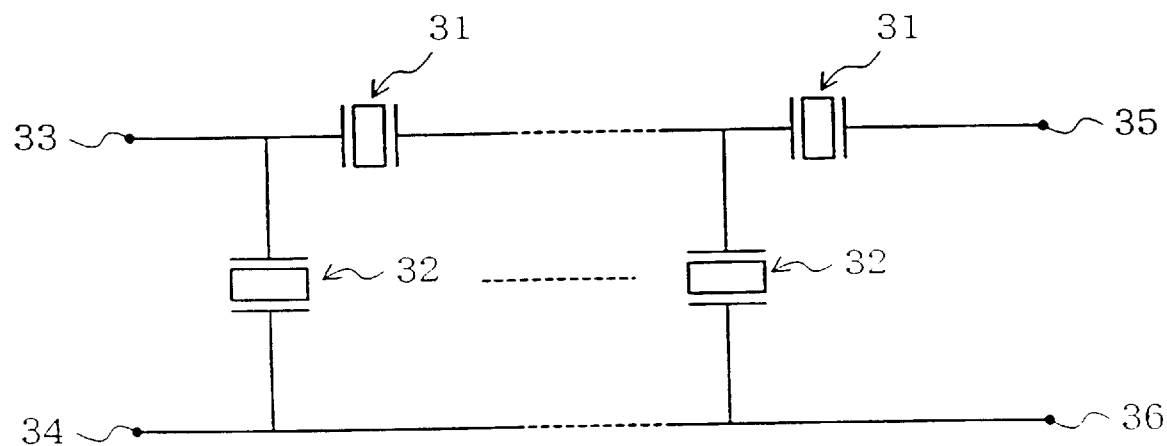
FIGS. 3(a) AND 3(b) present, respectively, a circuit diagram of a laddertype SAW filter in the prior art and a plan view illustrating the structure of a SAW resonator electrode pattern in the prior art.
Figure 3B:
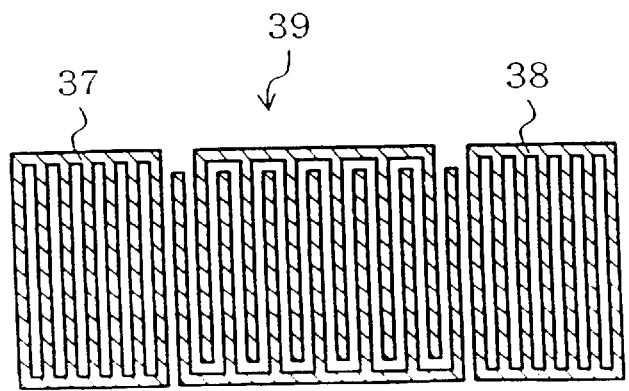
Figure 4:
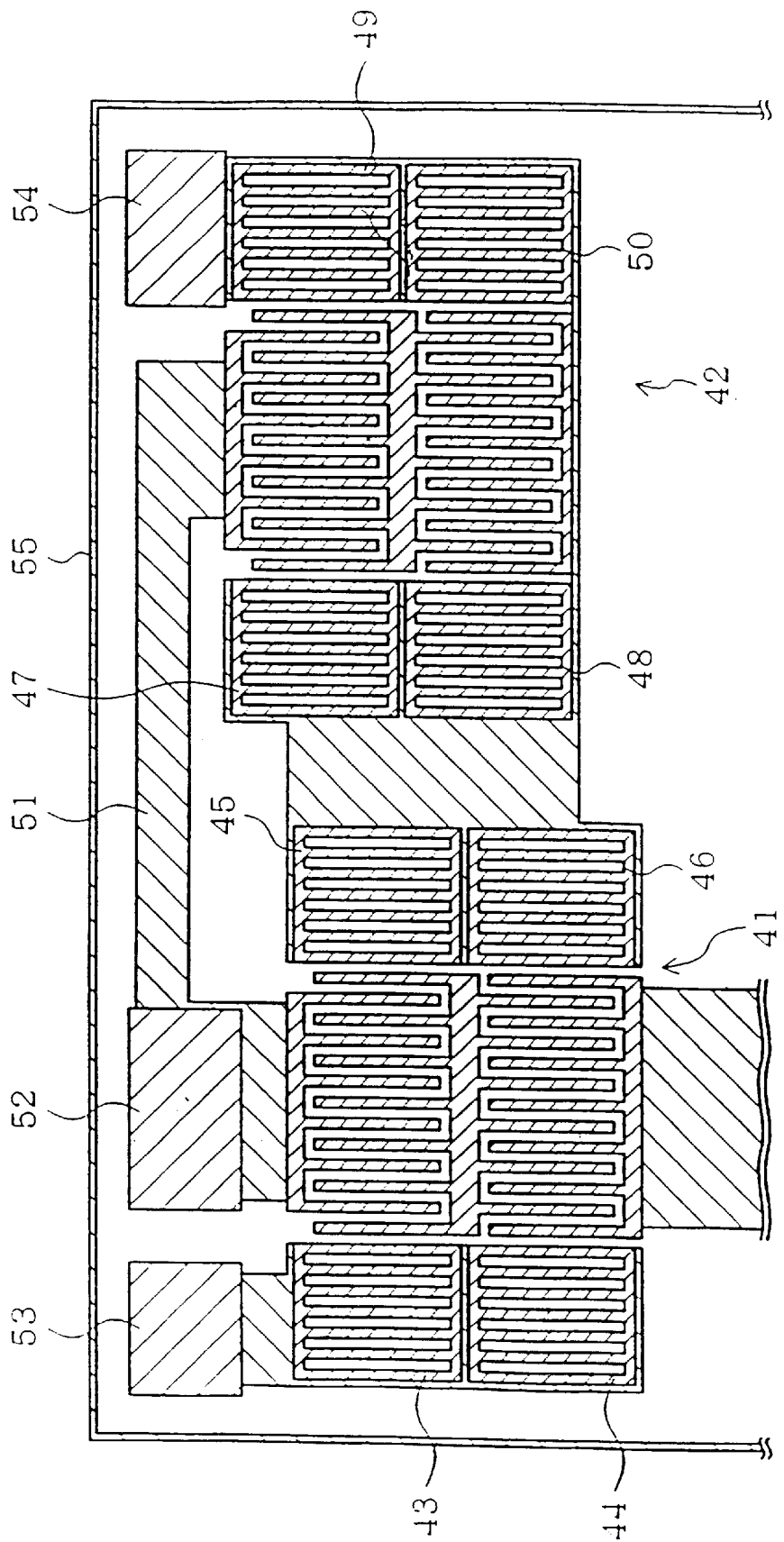
FIG. 4 is a plan view illustrating the structure of a SAW filter electrode pattern adopted in the prior art.
Figure 5:
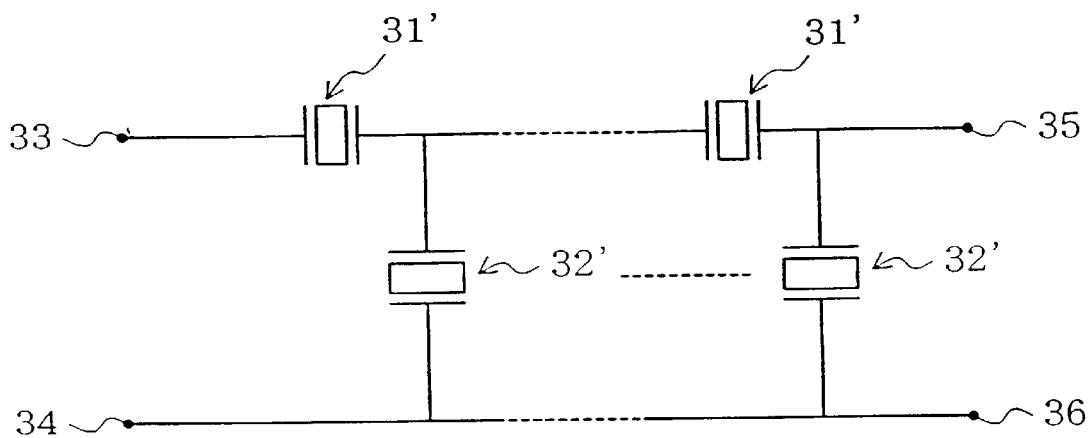
FIG. 5 is a circuit diagram of a ladder-type SAW filter in the prior art.

FIG. 2 is a plan view illustrating the structure of the SAW filter electrode pattern formed on a chip in the second embodiment of the present invention. This structure is achieved by adding probing pads 25, 26 and 27 within the connection patterns in the electrodes pattern in the first embodiment. By placing probing terminals in contact with the pads 25, 26 and 27, a pattern short on a pre-assembly chip can be detected. Since the patterns are connected with one another in a wafer state, such probing is performed after the wafer is cut along the dicing lines in the dicing step.

For instance, when probing a SAW resonator constituted of the tooth comb-type electrodes 1 and 2, one of the probing terminals is placed in contact with the output pad 52 and the other probing terminal is placed in contact with the pad 25 to measure the conductance or the inductance between them. If the pattern undergoing measurement is in an open state, the conductance value is indicated, whereas if it is in a shorted state, the inductance value is indicated. Thus, it becomes possible to make a quick judgement as to whether or not a given pattern is acceptable or defective.

If probing is to be performed on a SAW resonator constituted of the tooth comb-type electrodes 2 and 3, the probing terminals are placed in contact with the pads 25 and 26 to determine whether the pattern is open or shorted. Likewise, when probing a SAW resonator constituted of the tooth comb-type electrodes 4 and 5, the probing terminals are placed in contact with the output pad 52 and the pad 27 to determine whether the pattern is open or shorted. If probing is to be performed on a SAW resonator constituted of the tooth comb-type electrodes 5 and 6, the probing terminals are placed in contact with the pads 27 and 24 to determine whether the pattern is open or shorted.

If a series arm SAW resonator is determined to be shorted, its electrical frequency characteristics achieve a band pass manifesting filter characteristics. However, the insufficient attenuation quantity or the large insertion loss due to the short makes the circuit defective. When a parallel arm SAW resonator is determined to be shorted, grounding occurs within the circuit and as a result, desired frequency characteristics are not obtained. Apart from the viewpoint of good/poor frequency characteristics, unless all the SAW resonators present on a single chip are open, the chip is not determined to be acceptable in a pre-assembly appearance inspection.

In the embodiment achieved by adding the pads within the connection patterns in the first embodiment, the open/short state of the pattern between electrodes crossing each other can be ascertained by probing SAW resonators after the wafer is cut along the dicing lines. In other words, in addition to the advantage achieved in the first embodiment, another advantage is achieved in that any defective chips can be eliminated before the assembly step. In addition, even defective chips that cannot be detected through the appearance inspection step can be screened.

While the explanation is given above on an example in which tooth comb-type cross electrodes are provided over two levels, the present invention is not limited to this example and it may be adopted in a structure having tooth comb-type cross electrodes provided over a plurality of levels greater than two.

While the invention has been particularly shown and described with respect to the preferred embodiment of the surface acoustic pattern and the surface acoustic wave filter manufacturing method of the invention by referring to the attached drawings, the present invention is not limited to these examples and it will be understood by those skilled in the art that various changes in form and detail may be made therein without departing from the spirit, scope and teaching of the invention.

As explained above, according to the present invention, a surface acoustic filter wave pattern and a surface acoustic wave filter manufacturing method that make it possible to prevent an electrostatic breakdown from occurring in a SAW filter due to a discharge by grounding all the electrode patterns having tooth comb-type cross electrodes provided over a plurality of levels, are provided.

The entire disclosure of Japanese Patent Application No. 11-314355 filed on Nov. 4, 1999 including specification, claims, drawings and summary is incorporated herein by reference in its entirety.

What is claimed is:

1. A surface acoustic wave filter pattern achieved by connecting surface acoustic wave resonators, each having tooth comb-type cross electrodes provided over a plurality of levels and reflectors, in a ladder pattern, each said resonator including an inter-digital transducer with a common center electrode having first and second groups of comb-like teeth extending in opposite directions along a surface of a chip, first and second comb-type electrodes on said surface whose comb teeth extend respectively between the teeth of the first and second groups of teeth, and a pair of conductive reflector patterns disposed on said surface at each end of said transducer adjacent the respective first and second comb-type electrodes;

connection patterns connecting and grounding all conductive patterns on the surface of the chip via dicing lines, on said chip surface, with each common electrode being connected to a dicing line via a respective connection line extending between two reflector patterns of a said pair of reflector patterns for the respective resonator;

a series connected resonator of the ladder pattern has one of its first and second electrodes connected to an input signal terminal or an output signal terminal, and the other of its first and second electrodes connected to one of said first and second electrodes of a parallel connected resonator; and, a parallel connected resonator of the ladder pattern has one of its first and second electrodes connected to one of the first and second electrodes of a series connected resonator and the other of its first and second electrodes connected to ground.

2. A surface acoustic wave filter pattern according to claim 1, wherein: a pad is provided within said connection patterns.

3. A surface acoustic wave filter pattern according to claim 1 wherein:
   each series connected resonator of the ladder pattern is disposed adjacent to a parallel connected resonator of the ladder pattern with longitudinal axes of the respective common electrodes of the series connected and parallel connected resonators extending in the same direction; and,
   said other of said first and second electrodes of the series connected resonator is connected to one of said first and second electrodes of an adjacent parallel connected resonator.

4. A surface acoustic wave filter according to claim 3, wherein the two reflector patterns of the pair of reflector patterns between which the connection extends are physically connected to one another only via respective connecting lines connected to the dicing line.

5. A surface acoustic wave filter pattern, comprising:
   an input signal terminal;
   a first series arm surface acoustic wave resonator having first and second groups of comb-like teeth and a common electrode, with the common electrode being disposed between the first group of comb-like teeth and the second group of comb-like teeth, and with the first group of comb-like teeth connected to the input signal terminal;
   a second series-arm surface acoustic wave resonator connected to the second group of comb-like teeth;
   two reflector patterns respectively disposed next to the first and second groups of comb-like teeth;
   a connection pattern connected to the common electrode and extending between the two reflector patterns;
   a parallel arm surface acoustic wave resonator having first and second electrodes, with the first electrode being connected to the input signal terminal and the first group of comb-like teeth, and with the second electrode disposed opposite the first electrode;
   a dicing line formed around the first and second series arm surface acoustic resonators and the first parallel arm surface acoustic wave resonator;
   a conductive pattern formed on the dicing line; and
   wherein the common electrode is connected with the two reflector patterns, the first and second groups of comb-like teeth and the second electrode of the first parallel arm surface acoustic wave resonator through the connection pattern and the conductive pattern on the dicing line.

6. A surface acoustic wave filter pattern according to claim 5, wherein the conductive pattern is connected to ground.

7. A surface acoustic wave filter pattern according to claim 5, wherein a pad is provided on the connection pattern.

8. A surface acoustic wave filter pattern according to claim 5, further comprising:
   a further parallel arm surface acoustic wave resonator connected to the second group of comb-like teeth of the first series arm surface acoustic wave resonator and the second series arm surface acoustic wave resonator.

9. A suface acoustic wave filter pattern, comprising:
   an output signal terminal;
   a first series arm surface acoustic wave resonator having first and second groups of comb-like teeth and a common electrode, with the common electrode being disposed between the first group of comb-like teeth and the second group of comb-like teeth, and with the first group of comb-like teeth being connected to the output signal terminal;
   a second series-arm surface acoustic wave resonator connected to the second group of comb-like teeth;
   two reflector patterns respectively disposed next to the first and second groups of comb-like teeth;
   a connection pattern connected to the common electrode and extending between the two reflector patterns;
   a parallel are surface acoustic wave resonator having first and second electrodes, with the first electrode connected to the output signal terminal and the first group of comb-like teeth, and with the second electrode disposed opposite the first electrode;
   a dicing line formed around the first and second series arm surface acoustic wave resonators and the first parallel arm surface acoustic wave resonator;
   a conductive pattern being formed on the dicing line; and
   wherein the common electrode is connected with the two reflector patterns, the first and second groups of comb-like teeth and the second electrode of the first parallel arm surface acoustic wave resonator through the connection pattern and the conductive pattern on the dicing line.

10. A surface acoustic wave filter pattern according to claim 9, wherein the conductive pattern is connected to ground.

11. A surface acoustic wave filter pattern according to claim 9, wherein a pad is provided on the connection pattern.

12. A surface acoustic wave filter pattern according to claim 9, further comprising:
   a further parallel arm surface acoustic wave resonator connected to the second group of comb-like teeth of the first series arm surface acoustic wave resonator and the second series arm surface acoustic wave resonator.

13. A surface acoustic wave filter pattern, comprising:
   an input signal terminal;
   a first parallel arm surface acoustic wave resonator having first and second groups of comb-like teeth and a common electrode, with the common electrode being disposed between the first group of comb-like teeth and the second group of comb-like teeth, and with the first group of comb-like teeth connected to the input signal terminal;
   two reflector patterns respectively disposed next to the first and second groups of comb-like teeth;
   a connection pattern connected to the common electrode and extending between the two reflector patterns;
   a first series arm surface acoustic wave resonator having first and second electrodes, with the first electrode connected to the input signal terminal and the first group of comb-like teeth, and with the second electrode disposed opposite the first electrode;
   a second series-arm surface acoustic wave resonator connected to the second electrode of the first series arm surface acoustic wave resonator;
   a dicing line formed around the first and second series arm surface acoustic wave resonators and the first parallel arm surface acoustic wave resonator;

a conductive pattern formed on the dicing line; and wherein the common electrode is connected with the two reflector patterns, the first and second groups of comb-like teeth and the second electrode of the first series arm surface acoustic wave resonator through the connection pattern and the conductive pattern on the dicing line.

14. A surface acoustic wave filter pattern according to claim 13, wherein the conductive pattern is connect to ground.

15. A surface acoustic wave filter pattern according to claim 13, wherein a pad is provided on the connection pattern.

16. A surface acoustic wave filter pattern according to claim 13, further comprising:

a second parallel arm surface acoustic wave resonator connected to the second electrode of the first series arm surface acoustic wave resonator and the second series arm surface acoustic wave resonator.

17. A surface acoustic wave filter pattern, comprising:

an output signal terminal;

a parallel arm surface acoustic wave resonator having first and second groups of comb-like teeth and a common electrode, with the common electrode being disposed between the first group of comb-like teeth and the second group of comb-like teeth, and with the first group of comb-like teeth being connected to the output signal terminal;

two reflector patterns being respectively disposed next to the first and second groups of comb-like teeth;

a connection pattern connected to the common electrode and extending between the two reflector patterns;

a first series arm surface acoustic wave resonator having first and second electrodes, with the first electrode connected to the output signal terminal and the first group of comb-like teeth, and with the second electrode disposed opposite the first electrode;

a second series-arm surface acoustic wave resonator connected to the second electrode of the first series arm surface acoustic wave resonator;

a dicing line formed around the first and second series arm surface acoustic wave resonator and the parallel arm surface acoustic wave resonator;

a conductive pattern formed on the dicing line; and wherein the common electrode is connected with the two reflector patterns; the first and second groups of comb-like teeth and the second electrode of the first series arm surface acoustic wave resonator through the connection pattern and the conductive pattern on the dicing line.

18. A surface acoustic wave filter pattern according to claim 17, wherein the conductive pattern is connected to ground.

19. A surface acoustic wave filter pattern according to claim 17, wherein a pad is provided on the connection pattern.

20. A surface acoustic wave filter pattern according to claim 17, further comprising:

a further parallel arm surface acoustic wave resonator connected to the second electrode of the first series arm surface acoustic wave resonator and the second series arm surface acoustic wave resonator.

* * * * *